United States Patent

Miwa

[11] Patent Number: 5,824,589
[45] Date of Patent: Oct. 20, 1998

[54] METHOD FOR FORMING BIPOLAR TRANSISTOR HAVING A REDUCED BASE TRANSIT TIME

[75] Inventor: Hiroyuki Miwa, Kanagawa, Japan

[73] Assignee: Sony Corporation, Japan

[21] Appl. No.: 915,729

[22] Filed: Aug. 21, 1997

Related U.S. Application Data

[62] Division of Ser. No. 532,057, Sep. 22, 1995, abandoned.

[30] Foreign Application Priority Data

Sep. 26, 1994 [JP] Japan .................................. 6-229612

[51] Int. Cl.⁶ .................................................. H01L 21/331
[52] U.S. Cl. ...................... 438/309; 438/348; 438/349; 438/366; 438/370; 148/DIG. 10; 148/DIG. 11; 257/592
[58] Field of Search ................................. 438/309, 348, 438/349, 364, 367, 365, 366, 370; 148/DIG. 10, DIG. 11; 257/592

[56] References Cited

U.S. PATENT DOCUMENTS 5,217,909  6/1993  Bertagmolli ........................... 437/31
5,624,854  4/1997  Taft et al. ............................. 438/331
5,677,209  10/1997  Shon et al. ........................... 437/31

Primary Examiner—John Niebling
Assistant Examiner—Long Pham
Attorney, Agent, or Firm—Ronald P. Kananen

[57] ABSTRACT

A bipolar transistor has a performance and high reliability, which are by enhancing a withstand voltage between an emitter and a base. The bipolar transistor includes a first impurity diffusion layer in a semiconducting substrate, a first conductive film connected to the first diffusion layer, and an opening disposed in the first conductive film. A second impurity diffusion layer is formed in a portion, exposed from the opening portion, of the semiconducting substrate and is connected to the first impurity diffusion layer. A third impurity diffusion layer is formed so as to contain the second diffusion layer and side walls are formed on the side walls of the opening. A fourth impurity diffusion layer is formed in the third impurity diffusion layer in the opening surrounded by the side walls.

3 Claims, 5 Drawing Sheets

F I G. 3
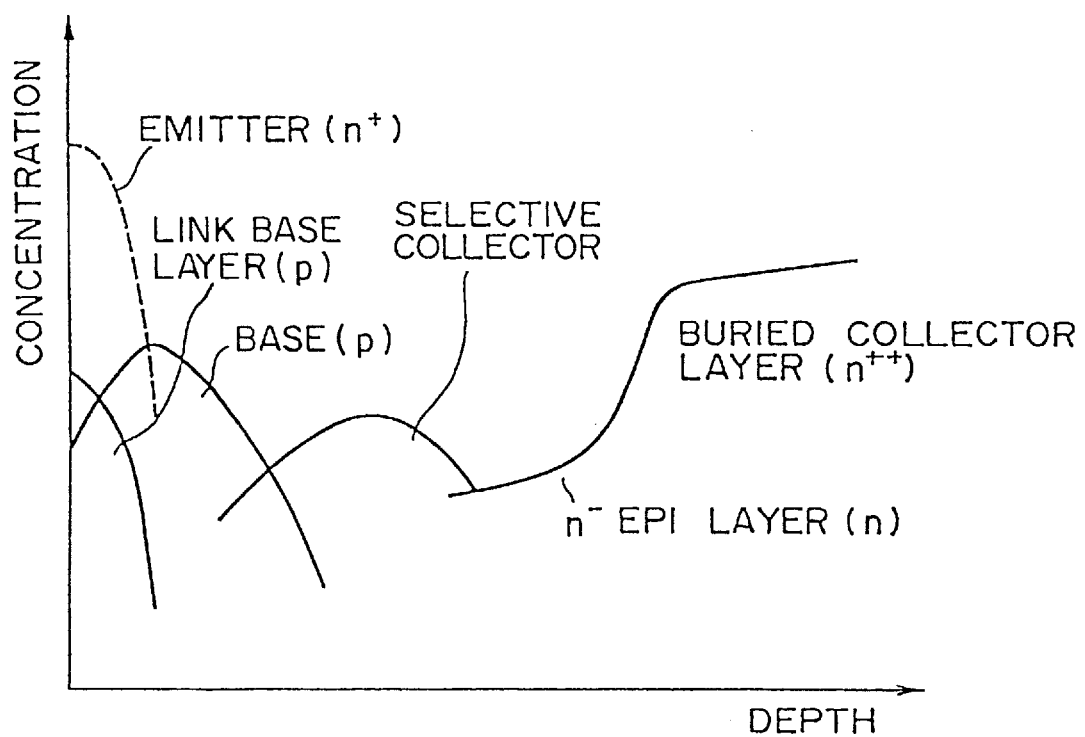

METHOD FOR FORMING BIPOLAR TRANSISTOR HAVING A REDUCED BASE TRANSIT TIME

This application is a division of application Ser. No. 08/532,057 filed Sep. 22, 1995, now abandoned.

BACKGROUND OF THE INVENTION

1. Field of the Invention

The present invention relates to a bipolar transistor and a method of fabricating the same.

2. Description of Related Art

Recently, in the field of semiconductor devices such as LSIs, there have been strong demands toward enhancement in performance of bipolar transistors. The enhancement in performance of bipolar transistors can be achieved by the shortening of a base transit time due to shortening of a base thickness, by lowering of a base resistance, and by reduction of a parasitic capacitance represented by a base-collector capacitance.

FIGS. 4A to 4C and FIGS. 5A to 5C are process diagrams illustrating a method of fabricating a high speed bipolar transistor (npn-type).

The bipolar transistor shown in these figures is of a double polysilicon structure in which an emitter electrode and a base electrode are formed of a poly-Si film 8 and a p-type poly-Si film 3, respectively. In this structure, the emitter electrode is isolated from the base electrode by means of an insulating side wall 7a for significantly reducing a base-collector capacitance. Moreover, the base transit time is shortened by making shallower the diffusion depth of the base for reducing a base thickness using a low energy ion implantation technique.

The bipolar transistor having the above-described structure is fabricated in the following procedures. First, as shown in FIG. 4A, an insulating film (SiO$_2$ film) 2 having a thickness of from 100 to 200 nm is formed over the surface of a silicon substrate 1 by Chemical Vapor-phase Deposition, or CVD.

As shown in FIG. 4B, an opening is formed for a base electrode of the bipolar transistor. Reference numeral 2a indicates an opening side wall. A p-type polysilicon (poly-Si) film 3 having a thickness of from 100 to 200 nm is formed over the surface by CVD. The p-type poly-Si film 3 serves as a base electrode. It is to be noted that the doping of a p-type impurity to the poly-Si can be also performed by ion implantation.

Next, as shown in FIG. 4C, an insulating film (SiO$_2$ film) 4 having a thickness of from 300 to 400 nm is formed over the surface of the wafer by CVD, and then an opening 10 for forming an emitter and a base is formed by dry etching for example, RIE, of the laminated films, the SiO$_2$ film 4 and the p-type poly-Si film 3. After that, an insulating film (SiO$_2$ film) 5 having a thickness of from 10 to 20 nm is formed over the surface by CVD, and a p-type impurity diffusion layer 6 is formed by ion implantation through the SiO$_2$ film 5. In this case, for example, ions of BF$_2$ are implanted in a dose of from $1 \times 10^{13}$ to $1 \times 10^{14}$ cm$^{-2}$ at an implantation energy of from 20 to 30 KeV. The p-type impurity diffusion layer 6 serves as the base, and the SiO$_2$ film 5 having a thickness of from 10 to 20 nm serves as a buffer layer for preventing a channeling tail upon ion implantation for forming the base. The ion implantation is followed by heat-treatment (annealing) for 10 to 20 minutes at 900° C., to form a P$^+$ contact layer (graft contact) 3a in the silicon substrate 1 by diffusion from the p-type poly-Si film 3.

Next, as shown in FIG. 5A, a side wall forming insulating film (SiO$_2$ film) 7 having a thickness of from 400 to 600 nm is formed over the surface by CVD. The SiO$_2$ film 7 is then removed by anisotropic etching such as RIE so as to form side walls 7a made of the SiO$_2$ film in the opening for forming an emitter and a base FIG. 5B. The side wall 7a has a function of isolating the base electrode made of the p-type poly-Si film 3 from an emitter electrode which will be formed later.

As shown in FIG. 5C, a poly-Si film 8 having a thickness of from 100 to 200 nm is patterned over the surface by CVD. The poly-Si film 8 thus patterned serves as the emitter electrode. The poly-Si film 8 is implanted with (n$^+$) ions, followed by heat-treatment, thus forming an emitter 9 as the n-type impurity diffusion layer. In this case, for example, ions of As are implanted in a dose of from $5 \times 10^{15}$ to $2 \times 10^{16}$ cm$^{-2}$ at an implantation energy of from 30 to 70 KeV. The ion implantation is followed by heat-treatment (annealing) for 10 to 20 minutes at 900° C. for performing diffusion of the emitter and base.

After that, while being not shown in the figure, each wiring for the base electrode, emitter electrode and the like is performed using a general wiring technique.

In the bipolar transistor having the above-described base-emitter structure, the concentration of the base 6 at a portion directly under the emitter 9 is high, and thereby an emitter-base withstand voltage is determined at this portion, thus obtaining only a withstand voltage of from 2 to 4 V.

To apply such a bipolar transistor to TTLI/0 Transistor-Transistor Logic Circuit Input/Output or the like, an emitter-base withstand voltage of about 3.5 V or more is required. Therefore, in general, the emitter-base withstand voltage is required to be ensured by increasing an ion implantation energy upon formation of the base 6 (see FIG. 4C) for reducing an impurity concentration of the base at the emitter-base junction.

However, such a method of enhancing the withstand voltage has the following disadvantages:

(1) The concentration of the base 6 is reduced at a portion directly under the side wall 7a for isolating the emitter 9 from the base 6, and consequently, at such a portion, a collector current or base re-recombination current tends to be varied, thus increasing variations in characteristics and reducing reliability.

(2) The thickness of the base 6 is extended by applying the high energy ion implantation to the base 6, with a result that the base transit time is increased, thus reducing the operating speed.

SUMMARY OF THE INVENTION

An object of the present invention is to provide a bipolar transistor with high performance and high reliability, which is obtained by enhancing an emitter-base withstand voltage.

To achieve the above object, according to a first aspect of the present invention, there is provided a bipolar transistor comprising:

a semiconducting substrate;

a first impurity diffusion layer having a first conducting type, which is formed in the semiconducting substrate;

a first conductive film connected to the first impurity diffusion layer;

an opening portion formed in the first conductive layer;

a second impurity diffusion layer having the first conducting type, which is formed at least in a portion, exposed from the opening portion, of the semiconducting substrate in such a manner as to be connected to the first impurity diffusion layer;

a third impurity diffusion layer having the first conducting type, which is formed in the semiconducting substrate in such a manner as to contain the second impurity diffusion layer, the second impurity diffusion layer having a surface impurity concentration equal to or more than that of the third impurity diffusion layer;

side walls formed of an insulating film in the opening portion; and a fourth impurity diffusion layer having a second conducting type, which is formed at least in a portion, exposed from the opening portion surrounded by the side walls, of the semiconducting substrate and in the third impurity diffusion layer, the second impurity diffusion layer having a diffusion depth equal to or less than that of the fourth impurity diffusion layer.

In the above bipolar transistor, preferably, the first impurity diffusion layer is a base contact; the third impurity diffusion layer is a base; the second impurity diffusion layer is a connecting layer between the base contact and the base; and the fourth impurity diffusion layer is an emitter.

According to a second aspect of the present invention, there is provided a bipolar transistor comprising:

a semiconducting substrate:

a first impurity diffusion layer having a first conducting type, which is formed in the semiconducting substrate;

a first conductive film connected to the first impurity diffusion layer;

an opening portion formed in the first conductive layer;

a second impurity diffusion layer having the first conducting type, which is formed at least in a portion, exposed from the opening portion, of the semiconducting substrate in such a manner as to be connected to the first impurity diffusion layer;

a third impurity diffusion layer having the first conducting type, which is formed in the semiconducting substrate in such a manner as to contain the second impurity diffusion layer;

side walls formed of an insulating film in the opening portion;

a fourth impurity diffusion layer having a second conducting type, which is formed at least in a portion, exposed from the opening portion surrounded by the side walls, of the semiconducting substrate and in the third impurity diffusion layer; and a fifth impurity diffusion layer having the second conducting type, which is formed directly under the second impurity diffusion layer, the fifth impurity diffusion layer having a diffusion depth in the maximum concentration from the substrate surface deeper than that of the third impurity diffusion layer.

In the above bipolar transistor, preferably, the first impurity diffusion layer is a base contact, the third impurity diffusion layer is a base; the second impurity diffusion layer is a link-up layer for linking the base contact to the base; the fourth impurity diffusion layer is an emitter; and the fifth impurity diffusion layer is a layer for reducing the concentration of the bottom of the base and/or part of a collector.

According to a third aspect of the present invention, there is provided a bipolar transistor comprising:

a semiconducting substrate:

a first impurity diffusion layer having a first conducting type, which is formed in the semiconducting substrate;

a first conductive film connected to the first impurity diffusion layer;

an opening portion formed in the first conductive layer;

a second impurity diffusion layer having the first conducting type, which is formed at least in a portion, exposed from the opening portion, of the semiconducting substrate in such a manner as to be connected to the first impurity diffusion layer;

a third impurity diffusion layer having the first conducting type, which is formed in the semiconducting substrate in such a manner as to contain the second impurity diffusion layer, the second impurity diffusion layer having a surface impurity concentration equal to or more than that of the third impurity diffusion layer;

side walls formed of an insulating film in the opening portion;

a fourth impurity diffusion layer having a second conducting type, which is formed at least in a portion, exposed from the opening portion surrounded by the side walls, of the semiconducting substrate and in the third impurity diffusion layer, the second impurity diffusion layer having a diffusion depth equal to or less than that of the fourth impurity diffusion layer; and a fifth impurity diffusion layer having the second conducting type, which is formed directly under the second impurity diffusion layer, the fifth impurity diffusion layer having a diffusion depth in the maximum concentration from the substrate surface deeper than that of the third impurity diffusion layer.

In the above bipolar transistor, preferably, the first impurity diffusion layer is a base contact; the third impurity diffusion layer is a base; the second impurity diffusion layer is a link-up layer for linking the base contact to the base; the fourth impurity diffusion layer is an emitter; and the fifth impurity diffusion layer is a layer for reducing the concentration of the bottom of the base and/or part of a collector.

According to a fourth aspect of the present invention, there is provided a method of fabricating a bipolar transistor comprising the steps of:

forming on a semiconducting substrate a first insulating film having a pattern in which the surface of the semiconducting substrate is partially exposed from the first insulating film;

sequentially forming a first conductive film and a second insulating film over the surface of the semiconducting substrate formed with the first insulating film, and then forming an opening portion so as to expose the surface of the semiconducting substrate;

forming a third insulating film on the opening portion and the first conductive film;

forming a first impurity diffusion layer having a first conducting type by applying ion implantation to the semiconducting substrate at a first energy through the third insulating film;

forming a second impurity diffusion layer having the first conducting type by applying ion implantation to the semiconducting substrate at a second energy;

forming a third impurity diffusion layer having the first conducting type in the semiconducting substrate connected to the first conductive layer;

forming side walls made of a fourth insulating layer on side walls of the opening portion of the semiconducting substrate in which the first, second and third impurity diffusion layers are formed;

forming a second conductive film in the opening portion so as to be connected to the first impurity diffusion layer; and forming a fourth impurity diffusion layer having a second conducting type in the second impurity diffusion layer by ion implantation applied through the second conductive layer.

In the above method, preferably, the second impurity diffusion layer is formed by ion implantation at the second energy, and thereafter a fifth impurity diffusion layer is formed under the first impurity diffusion layer by ion implantation at a third energy; and the first energy is lower than the second energy.

According to the present invention, since the link base layer 11 is formed by a low energy ion implantation, the concentration of the base (including the link base layer) at a portion directly under the side wall for isolating the emitter from the base can be increased without any increase in the concentration of the base at a portion directly under the emitter.

According to the present invention, the concentration of the collector at a portion directly under the base (diffusion layer) is selectively increased, and accordingly, an effective base thickness is reduced, thus suppressing the base transit time.

The above and other features and advantages of the present invention will becomes apparent from the following description which will be given with reference to the illustrative accompanying drawings.

BRIEF DESCRIPTION OF THE DRAWINGS

FIG. 3 is a schematic diagram of impurity profiles of respective diffusion layers disposed in the bipolar transistor of the present invention;

DETAILED DESCRIPTION OF THE PREFERRED EMBODIMENTS

Hereinafter, one embodiment of the present invention will be described with reference to the accompanying drawings.

FIGS. 1A, 1B and FIGS. 2A, 2B are process diagrams illustrating a method of fabricating a bipolar transistor of the present invention. These figures are sectional views showing the upper side of a substrate, particularly, an emitter portion and a base portion of an npn-transistor.

Figure 1A:
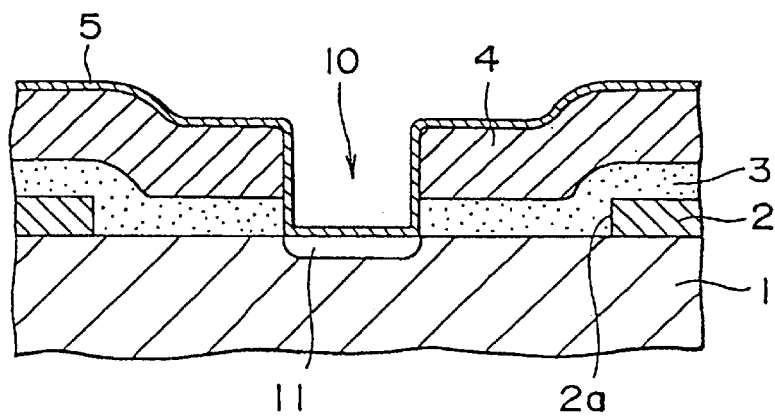
FIGS. 1A and 1B are process diagrams illustrating one embodiment of a method of fabricating a bipolar transistor of the present invention.
Figure 4A:
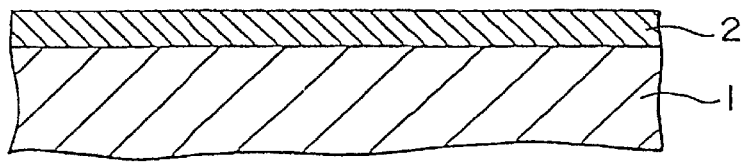
FIGS. 4A to 4C are process diagrams illustrating a method of fabricating a bipolar transistor.
Figure 4B:
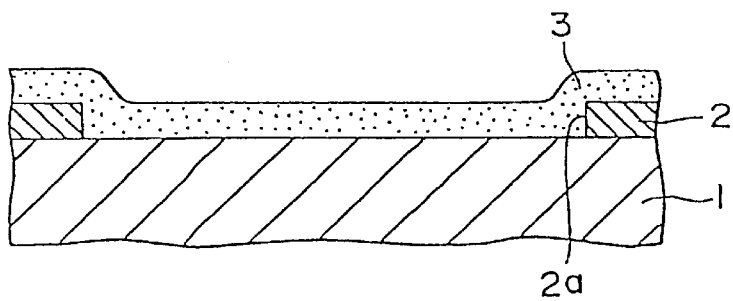
Figure 4C:
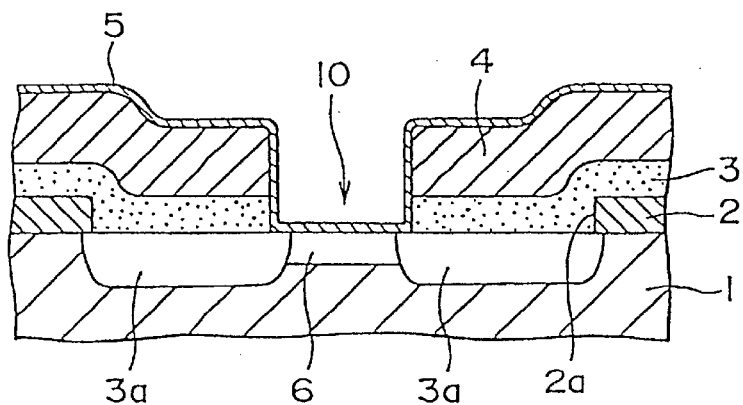
Figure 5A:
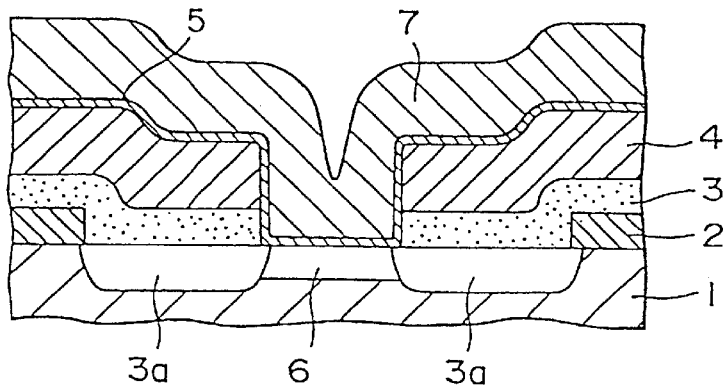
FIGS. 5A to 5C are process diagrams, continued from FIGS. 4A to 4C, illustrating the method of fabricating a bipolar transistor.
Figure 5B:
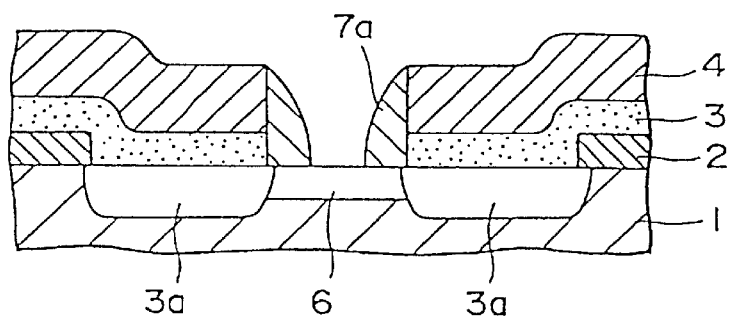
Figure 5C:
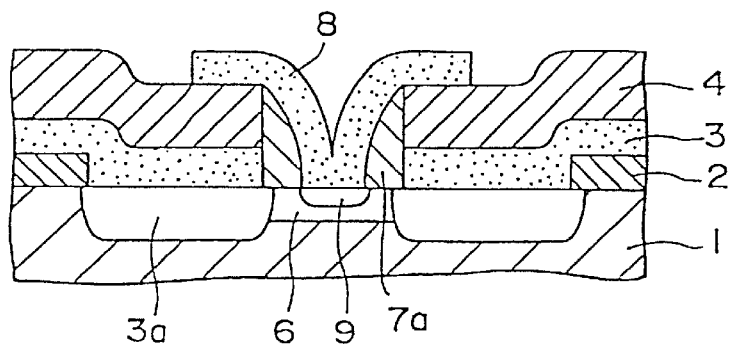

First, like the prior art method shown in FIGS. 4A and 4B, a $SiO_2$ film 2 (thickness: 100 to 200 nm) having opening side walls 2a and a p-type poly-Si film 3 (thickness: 100 to 200 nm) are formed on a silicon substrate 1 as a semiconducting substrate. Then, as shown in FIG. 1A, a $SiO_2$ film 4 having a thickness of from 300 to 400 nm is formed on the poly-Si film 3 by CVD. Then, an opening 10 for forming an emitter and a base is formed by etching (RIE) of the $SiO_2$ film 4 and the poly-Si film 3. A $SiO_2$ film 5 having a thickness of from 10 to 20 nm is formed over the surface by CVD, and then a p-type impurity diffusion layer 11 is formed by ion implantation under a condition specified by the present invention. The p-type impurity diffusion layer 11 serves as a link base layer. It is to be noted that the thin $SiO_2$ film 5 serves a buffer layer for preventing the channeling tail upon ion implantation for forming the link base layer.

The ion implantation condition for forming the p-type impurity diffusion layer (link base layer) 11 is as follows:

implanted ion: $BF_2$
energy: 5–20 KeV
dose: $1 \times 10^{12}$–$1 \times 10^{14}$ $cm^{-2}$
diffusion depth of link base layer: 30 to 50 nm The ion implantation of $BF_2$ at a low energy of from 5 to 20 KeV is equivalent to the ion implantation of B (boron) at a low energy of from 1 to 5 KeV.

The diffusion depth of the link base layer is as shallow as 30 to 50 nm, which is equal to or less than that of an emitter. As a result, the link base layer does not increase the concentration of the base impurity at a portion directly under the emitter.

Figure 1B:
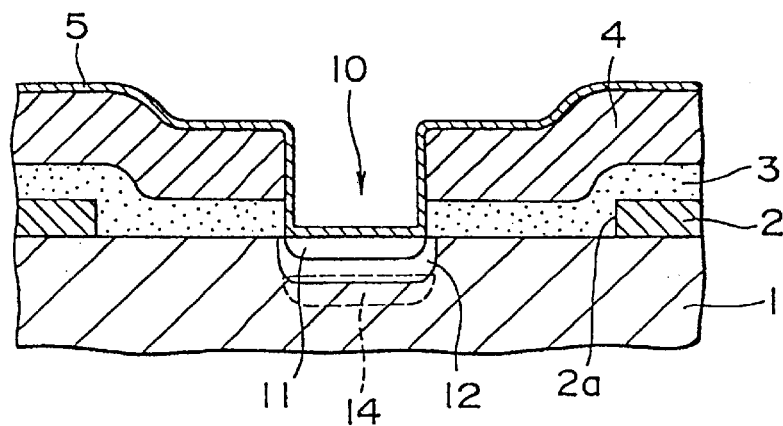

After the link base layer 11 is formed by ion implantation of $BF_2$, as shown in FIG. 1B, ions of a p-type impurity such as boron (B) are implanted in a dose of from $1 \times 10^{12}$ to $1 \times 10^{14}$ $cm^{-2}$ at an energy of from 10 to 100 KeV, to form a base 12 as a p-type impurity diffusion layer.

Further, ions of an n-type impurity such as phosphorous (P) are implanted in a dose of from $1 \times 10^{11}$ to $1 \times 10^{13}$ $cm^{-2}$ at an energy of from 100 to 400 KeV, to form a selective collector 14 as an n-type impurity diffusion layer, thus selectively increasing the collector concentration at a portion directly under the base 12 and reducing an effective base thickness.

With the above-described sequential processes, (1) the concentration of the base 12 (including the link base layer 11) at a portion directly under the side wall 7a isolates the emitter from the base without any increase in the base concentration at a portion directly under the emitter, thus preventing variations in characteristics due to variations in a correct current or the base re-recombination current at such a portion, and ensuring reliability; and (2) an increase in the thickness of the base 12 is suppressed.

Figure 2A:
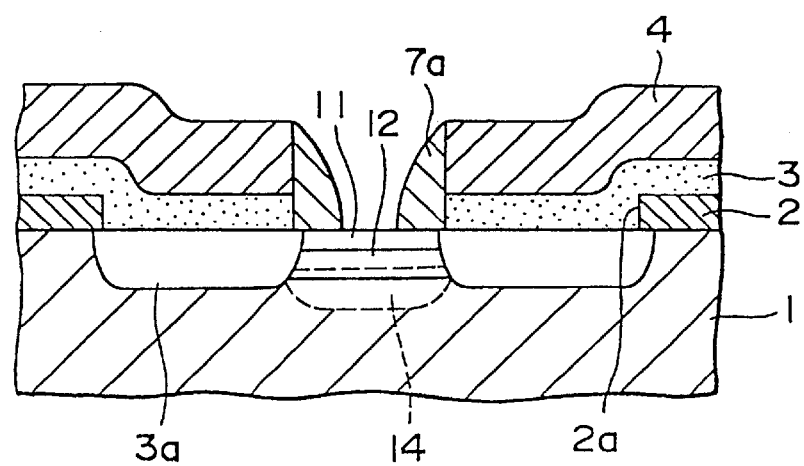
FIGS. 2A and 2B are process diagrams, continued from FIGS. 1A and 1B, illustrating the embodiment of a method of fabricating a bipolar transistor of the present invention.
Figure 2B:
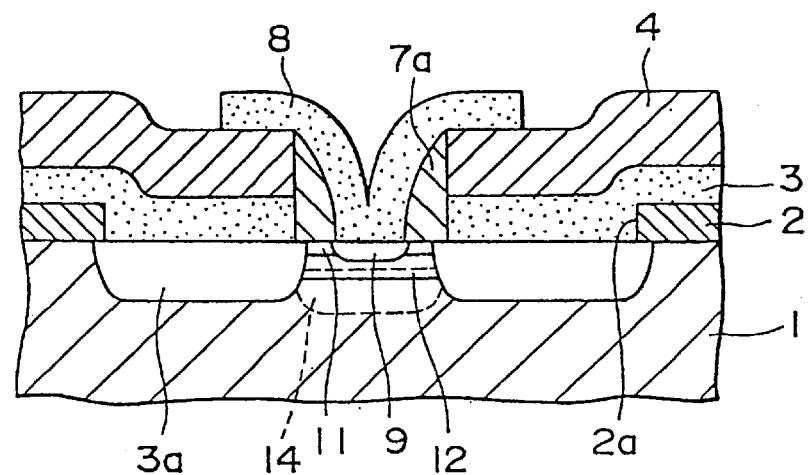

After that, as shown in FIG. 2A, heat-treatment (annealing) is performed for 10 to 20 minutes at 900° C., to diffuse the p-type impurity from the p-type poly-Si film 3 to the Si substrate, thus forming a $P^+$ contact layer 3a. The $p^+$ contact layer 3a serves as a graft base. In addition, the heat-treatment may be shared with the heat-treatment for emitter diffusion which will be performed later. Thus, the shallow diffusion for the link base layer and the base can be achieved. A side wall forming $SiO_2$ film having a thickness of from 400 to 600 nm is formed over the surface. After that, the $SiO_2$ film is removed by anisotropic etching such as RIE so as to form side walls 7a made of the $SiO_2$ film. The side wall 7a has a function of isolating the base electrode from an emitter electrode which will be formed later.

The poly-Si film having a thickness of from 100 to 200 nm is then formed, to thus form a patterned poly-Si film 8 serving as an emitter electrode. Next, the poly-Si film 8 is implanted with $n^+$ ions, followed by heat-treatment, to form an emitter (n-type impurity diffusion layer) 9.

The ion implantation is performed under the same condition as described in the prior art. For example, ions of As are implanted in a dose of from $5 \times 10^{15}$ to $2 \times 10^{16}$ $cm^{-2}$ at an energy of from 30 to 70 KeV. After that, the heat-treatment (annealing) for emitter diffusion is performed for 10 to 20 minutes at 900° C.

In this embodiment, by the above-described heat-treatment for emitter diffusion, the link base layer 11, base 12, and a highly doped selective collector 14 positioned directly under the base 12 are also substantially formed by diffusion. After that, each wiring for a base electrode, emitter electrode and the like is formed by a general wiring technique.

FIG. 3 is a schematic diagram of impurity profiles of respective diffusion layers disposed in the bipolar transistor in this embodiment.

As shown in the figure, the diffusion depth of the link base layer 11 is equal to or less than that of the emitter 9, and the surface concentration of the link base layer 11 is equal to or more than that of the base 12.

The diffusion depth (from the surface of the substrate) in the peak concentration of the selective collector 14 formed directly under the link base layer 11 is larger than that of the base 12.

In the above-described embodiment, the link base layer 11, the base 12, and the highly doped selective collector 14 positioned directly under the base are formed by ion implantation by way of the same opening portion; however, various modifications are possible within the scope of the present invention. For example, they may be formed after formation of the side walls 7a for isolating the emitter form the base. Moreover, each diffusion layer may be formed by plasma doping or the like. In addition, the profiles of the emitter, base and collector can be selectively formed in accordance with the kinds of transistors. The profiles of the link base layer and the highly doped collector layer positioned directly under the base can be optimized in accordance with the kinds of the transistors.

Although the present invention has been described hereinabove with reference to the preferred embodiment thereof, it is to be understood that the invention is not limited to the embodiment alone, and a variety of other modifications and variations will be apparent to those skilled in the art without departing from the spirit of the invention.

The scope of the invention, therefore, is to be determined solely by the appended claims.

What is claimed is:

1. A method of fabricating a bipolar transistor comprising the steps of:

forming on a semiconducting substrate a first insulating film having a pattern in which the surface of said semiconducting substrate is partially exposed from said first insulating film;

sequentially forming a first conductive film and a second insulating film over the surface of said semiconducting substrate formed with said first insulating film, and then forming an opening portion so as to expose the surface of said semiconducting substrate;

forming a third insulating film on said opening portion and said first conductive film;

forming a first impurity diffusion layer having a first conducting type by applying ion implantation to said semiconducting substrate at a first energy through said third insulating film;

forming a second impurity diffusion layer having the first conducting type by applying ion implantation to said semiconducting substrate at a second energy;

forming a third impurity diffusion layer having the first conducting type in said semiconducting substrate connected to said first conductive layer;

forming side walls made of a fourth insulating layer on side walls of said opening portion of said semiconducting substrate in which said first, second and third impurity diffusion are formed;

forming a second conductive film in said opening portion so as to be connected to said first impurity diffusion layer; and forming a fourth impurity diffusion layer having a second conducting type in said second impurity diffusion layer by ion implantation applied through said second conductive layer.

2. A method of fabricating a bipolar transistor according to claim 1, wherein said second impurity diffusion layer is formed by ion implantation at said second energy, and thereafter a fifth impurity diffusion layer is formed under said first impurity diffusion layer by ion implantation at a third energy.

3. A bipolar transistor according to claim 1, wherein said first energy is lower than said second energy.

* * * * *